United States Patent [19]

Nakano

[11] Patent Number: 5,191,233
[45] Date of Patent: Mar. 2, 1993

[54] FLIP-FLOP TYPE LEVEL-SHIFT CIRCUIT
[75] Inventor: Masaji Nakano, Tokyo, Japan
[73] Assignee: NEC Corporation, Tokyo, Japan
[21] Appl. No.: 847,930
[22] Filed: Mar. 6, 1992
[30] Foreign Application Priority Data Mar. 6, 1991 [JP] Japan .................................. 3-39707

[51] Int. Cl.⁵ .................... H03K 5/00; H03K 3/2885; H03K 19/0175
[52] U.S. Cl. .................................. 307/264; 307/272.1; 307/272.3; 307/279; 307/291; 307/475
[58] Field of Search .................. 307/264, 272.1, 272.2, 307/272.3, 279, 291, 292, 475

[56] References Cited

U.S. PATENT DOCUMENTS

| | | | |
|---|---|---|---|
| 3,805,093 | 4/1974 | Hodemaekers | 307/291 |
| 4,130,897 | 12/1978 | Horne et al. | 307/279 |
| 4,267,466 | 5/1981 | Kung et al. | 307/279 |
| 4,629,911 | 12/1986 | Bebernes et al. | 307/279 |
| 4,633,098 | 12/1986 | Mahmud | 307/279 |
| 4,656,371 | 4/1987 | Binet et al. | 307/279 |
| 4,680,481 | 7/1987 | Schmitt-Landsiedel et al. | 307/291 |
| 4,786,825 | 11/1988 | O'Shaughnessy et al. | 307/279 |
| 4,868,415 | 9/1989 | Dunn | 307/264 |
| 4,918,341 | 4/1990 | Galbraith et al. | 307/279 |
| 4,920,284 | 4/1990 | Denda | 307/264 |
| 5,017,815 | 5/1991 | Shah et al. | 307/279 |
| 5,045,721 | 9/1991 | Yan | 307/279 |

Primary Examiner—John S. Heyman
Assistant Examiner—T. Cunningham

[57] ABSTRACT

In a flip-flop type level-shift circuit, a P-channel MOS transistor whose gate and drain are tied together is connected between a higher potential power supply terminal and a gate of an output stage P-channel MOS transistor. The P-channel MOS transistor together with the output stage P-channel MOS transistor constitutes a current-mirror circuit. The level-shift circuit can provide a constant-current output as high level output, thus making it unnecessary to include a high resistance protection resistor, which has hitherto been connected to an output terminal of the level-shift circuit to prevent destruction of the circuit caused by short-circuiting of the output, as well as permitting increase of the intergration density, reduction of the size and cost and improvement of the reliability of the circuit.

4 Claims, 4 Drawing Sheets

FLIP-FLOP TYPE LEVEL-SHIFT CIRCUIT

BACKGROUND OF THE INVENTION (1) Field of the Invention

The present invention relates to level-shift circuits and, more particularly, to a level-shift circuit in an output stage of a high-withstanding driver for driving such as a flat-panel display and an electrostatic plotter.

(2) Description of the Related Art

Conventional level-shift circuits to which the present invention relates and which are frequently employed for output stages of high-withstanding drivers as noted above are shown in FIGS. 1A, 1B and FIG. 2. These circuits will now be described.

The conventional circuit shown in FIG. 1A is a level-shift circuit of BiCMOS type (Bipolar-CMOS) which uses a bipolar transistor $Q_P$ and MOS field-effect transistors (hereinafter referred to as "MOS transistor"s). The output PNP-transistor $Q_P$ is controlled by on-off controlling of its base current.

The conventional circuit shown in FIG. 1B is formed by MOS transistors alone. The gate-source voltage of the output stage P-channel MOS transistor P4 is controlled by on-off controlling of a bias current flowing through a resistor R.

The conventional circuit shown in FIG. 2 is an example of a flip-flop type level-shift circuit. This circuit features that no steady-state (or constant) bias current is necessary.

The level-shift circuits as described above are employed for output stages of various high-withstanding drivers. The uses of the high-withstanding driver are classified into those requiring comparatively large output currents as used in flat-panel displays and those without need of any large output current as used in electrostatic plotters.

In the case where a small current suffices for the purpose, it is necessary to protect the circuit against the destruction caused by, for example, short-circuiting of an output, by rather limiting the output current with such means as a current limiter.

To this end, a protection resistor having a high resistance value is connected to the output terminal. This resistor usually has a resistance value of 100KΩ or above.

However, the provision of such protection resistor which is externally connected to the driver's output terminal necessitates extra steps for control and connection of parts and materials, thus increasing the cost of manufacture. In additon, an increase of the number of connections is undesirable from the standpoint of the reliability of connections. Such problems posed by the external connection of the protection resistor are particularly serious for drivers which have a large number of output terminals.

It may be thought to provide the protection resistor as above inside the driver. However, a resistor having a resistance value of 100KΩ or above requires a very large occupying area if it is to be realized on a semiconductor substrate, and the provision of a large number of resistors occupying such a large area is very disadvantageous for the integration density increase and the size reduction of the driver.

It may be further thought to form the output stage of the driver as a constant-current output circuit. With the conventional circuits, however, it is difficult to provide a constant-current output as a high level output although it is easy to provide a constant-current output as the low level output.

SUMMARY OF THE INVENTION

It is, therefore, an object of the invention to overcome the problems existing in the conventional circuits and to provide an improved flip-flop type level-shift circuit which can provide a constant-current output as the high level output.

To attain the above and other objects of the invention, there is provided a flip-flop type level-shift circuit, which comprises:

a flip-flop circuit provided between a higher and a lower potential power supply terminal and having a first and second output node;

an output stage circuit including a first PMOS transistor and an NMOS transistor connected in series between the higher and lower potential power supply terminals, the first PMOS transistor having a source connected to the higher potential power supply terminal, a gate connected to the first output node of the flip-flop circuit, and a drain connected to an output terminal of the level-shift circuit, and the NMOS transistor having a drain connected to the output terminal, a gate receiving a gate control signal, and a source connected to the lower potential power supply terminal; and a second PMOS transistor connected between the higher potential power supply terminal and the gate of the first PMOS transistor in the output stage circuit, the second PMOS transistor having a source connected to the higher potential power supply terminal, and a gate and a drain connected in common to the gate of the first PMOS transistor, and constituting a current-mirror circuit together with the first PMOS transistor.

The flip-flop type level-shift circuit according to the invention may further comprise a third P-channel MOS transistor connected between the higher potential power supply terminal and the second output node of the flip-flop circuit and having the source connected to the higher potential power supply terminal and the drain and gate both connected to the second output node.

BRIEF DESCRIPTION OF THE DRAWINGS

The above and other objects, features and advantages of the invention will become more apparent from the following description of the preferred embodiments thereof when the same is read with reference to the accompanying drawings, in which.

PREFERRED EMBODIMENTS OF THE INVENTION

Now, preferred embodiments of the invention will be described with reference to the accompanying drawings.

Figure 1A:
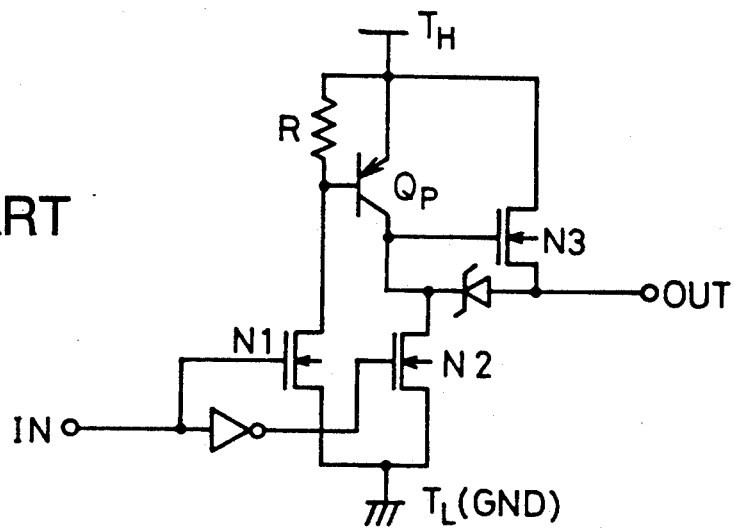
FIG. 1A is a circuit diagram showing a first example of a conventional level-shift circuit.
Figure 1B:
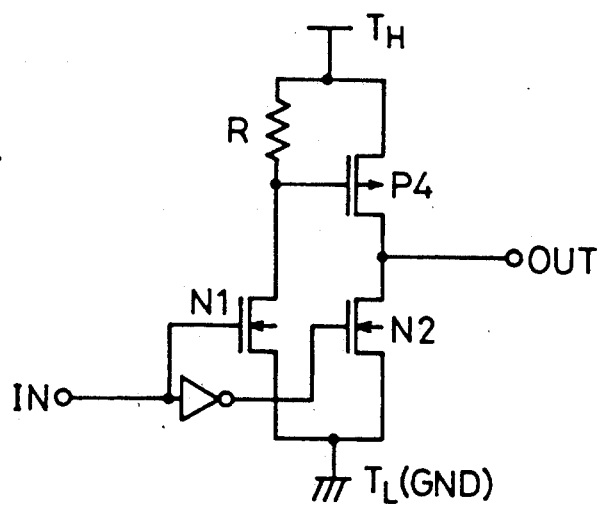
FIG. 1B is a circuit diagram showing a second example of a conventional level-shift circuit.
Figure 2:
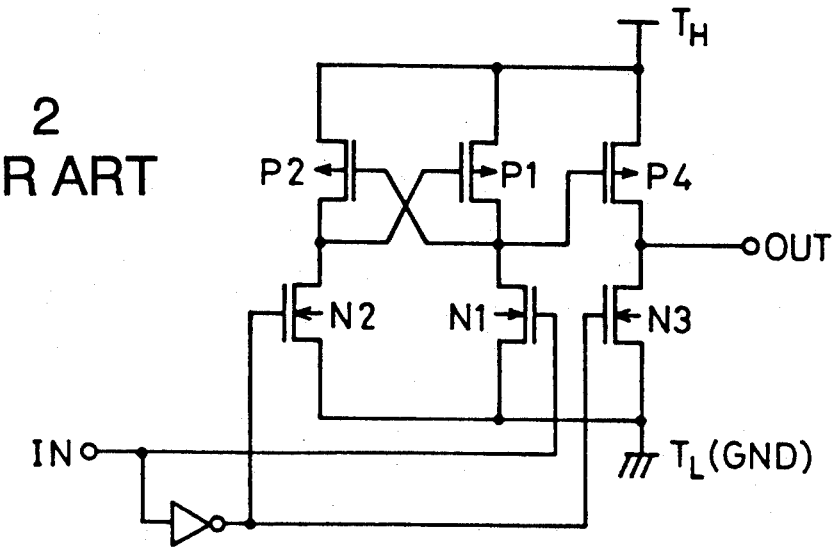
FIG. 2 is a circuit diagram showing a third example of a conventional level-shift circuit of a flip-flop type.
Figure 3:
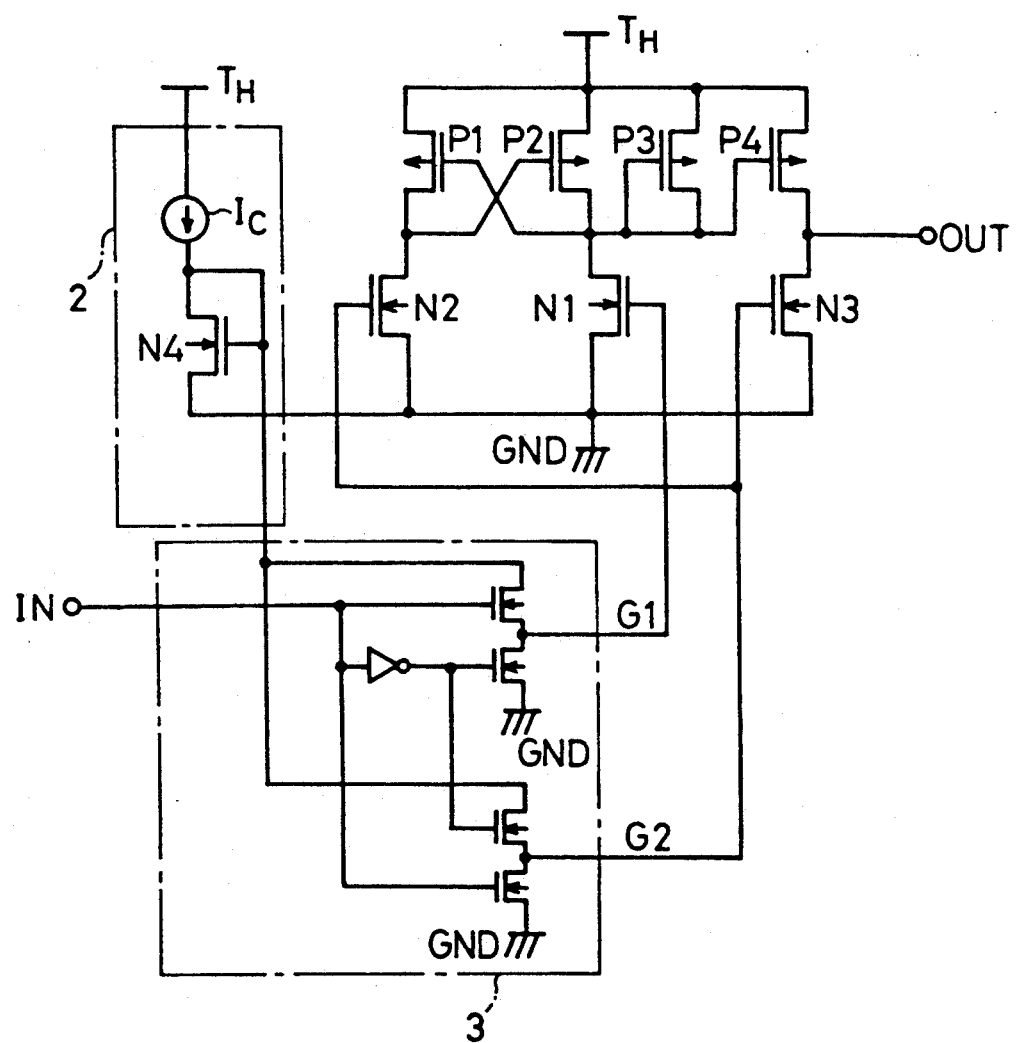
FIG. 3 is a circuit diagram showing a first embodiment of a flip-flop type level-shift circuit according to the invention.

FIG. 3 is a circuit diagram showing a first embodiment of the invention. This embodiment is a flip-flop type level-shift circuit. The difference of this embodiment from the like conventional flip-flop type level-shift circuit shown in FIG. 2 is that there is provided a P-channel MOS transistor P3 between the gate of an output stage P-channel MOS transistor P4 and a higher potential power supply terminal $T_H$ in such a manner that the gate and drain connected in common of the PMOS transistor P3 are connected to the gate of the PMOS transistor P4 and the source thereof is connected to the higher potential power supply terminal $T_H$. The PMOS transistor P3 together with the output PMOS transistor P4 constitutes a current-mirror circuit.

This embodiment comprises, in addition to the above explained level-shift circuit, a reference voltage generating circuit 2 and a control circuit 3. The reference voltage generating circuit 2 is formed by a constant-current source $I_C$ and an NMOS transistor N4 which functions as an active load. The control circuit 3 has two series circuits of NMOS transistors, each series circuit being connected between an output node of the reference voltage generating circuit 2 and a lower potential power supply terminal $T_L$ (GND). The combination circuit of these two circuits 2, 3 serves to produce, in accordance with an input signal IN, a gate control signal G1 for controlling the gate potential of the NMOS transistor N1 in the flip-flop circuit and a gate control signal G2 for controlling the gate potential of the NMOS transistor N2 in the flip-flop circuit and also that of the output stage NMOS transistor N3. They may be provided externally, as will be understood from a description given later.

Figure 4A:
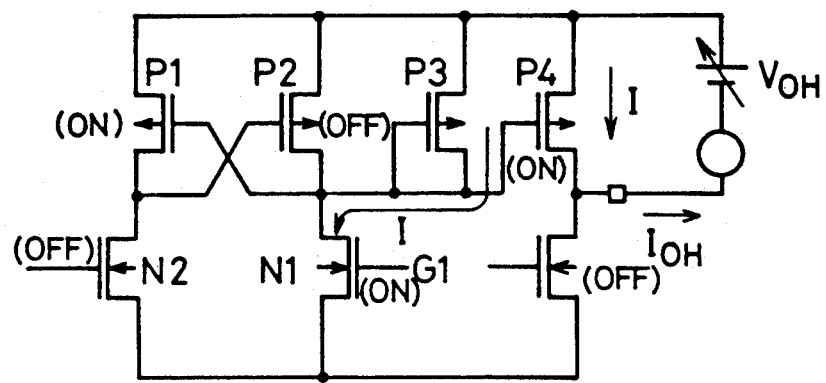
FIG. 4A is a circuit diagram showing an essential part of the level-shift circuit in the operation of the first embodiment shown in FIG. 3.

The operation of the embodiment will be described with reference to FIGS. 4A and 4B. FIG. 4A shows an essential part of the level-shift circuit shown in FIG. 3 when the output is at a high level.

Referring to FIG. 4A, the current I flowing through the NMOS transistor N1 in the flip-flop circuit determines the output current $I_{OH}$ outputted from the output stage PMOS transistor P4 by the operation of the current-mirror circuit formed by the PMOS transistors P3 and P4.

In other words, the output current $I_{OH}$ of the high level output is determined by the amplitude of the gate control signal G1 applied across the gate and source of the NMOS transistor N1.

Figure 4B:
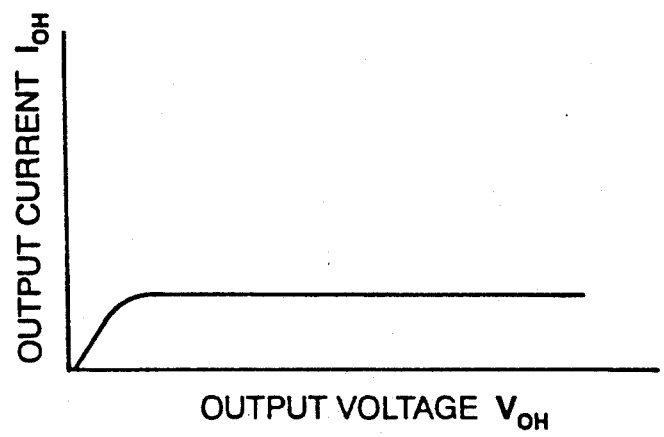
FIG. 4B is a graph showing a current versus voltage characteristic of a P-channel MOS transistor shown in FIG. 4B.
Figure 5:
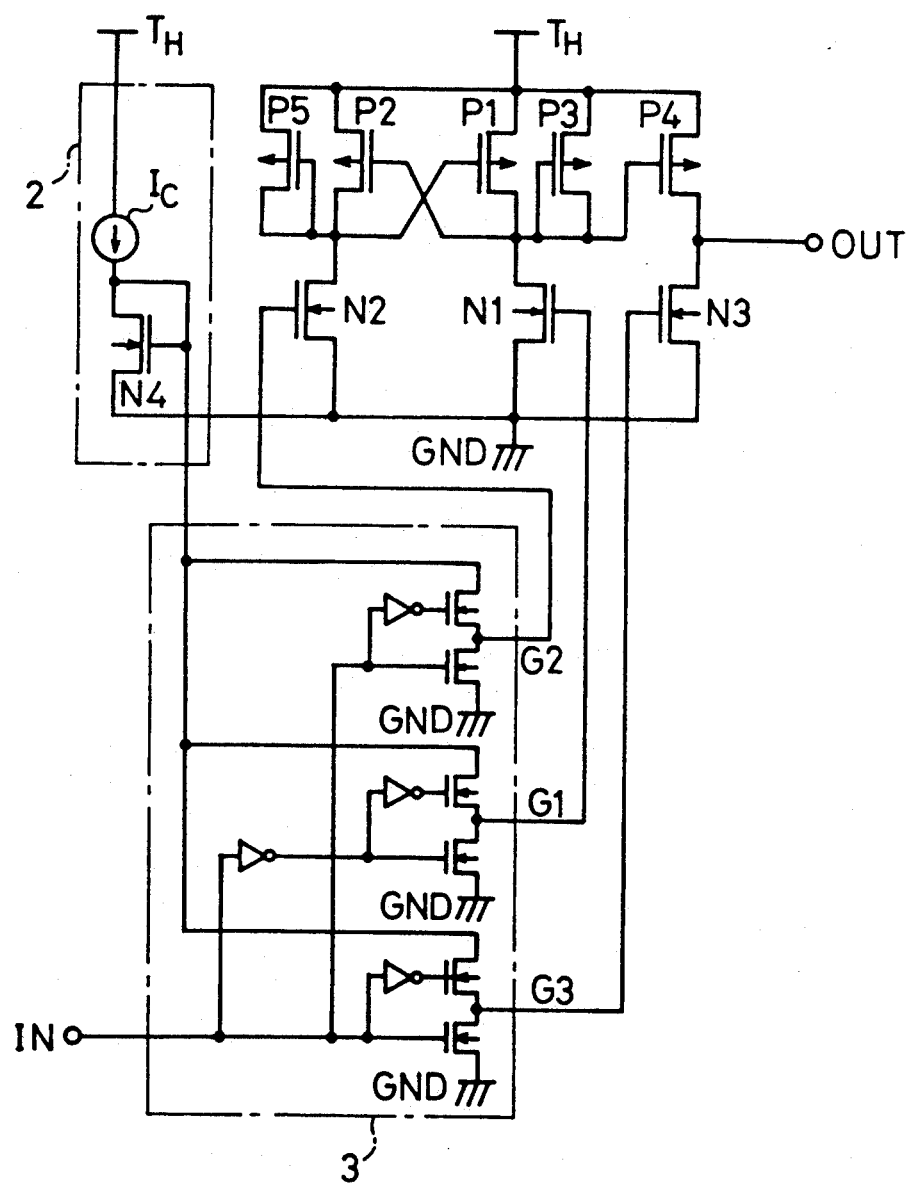
FIG. 5 is a circuit diagram showing a second embodiment of a flip-flop type level-shift circuit according to the invention.

In this instance, as the output stage PMOS transistor P4 is operating in the saturated region, it presents as the current-voltage characteristic (i.e., the relation between the output current $I_{OH}$ and the source-drain voltage $V_{OH}$) a constant-current characteristic as shown in FIG. 4B. Thus, the output current $I_{OH}$ can be controlled accurately as desired.

For instance, where the saturation current is limited to about 100 μA, even if there occurs short-circuitting of the output while a high voltage driving as high as about 200 V is being effected, the power consumption can be held as low as about 20 mW, and thus it is possible to avoid thermal destruction of the circuit.

As noted above, the amplitude of the control signal G1 applied to the gate of the NMOS transistor N1 can be set to a desired level by the reference voltage generating circuit 2 and also the control circuit 3.

FIG. 4 shows a second embodiment of the invention.

This embodiment is different from the preceding first embodiment shown in FIG. 3 in that a PMOS transistor P5 is connected in parallel with the PMOS transistor P2 of the flip-flop circuit in such a manner that the gate and drain connected in common of the PMOS transistor P5 are connected to the drain of the PMOS transistor P2 and the source thereof is connected to the source of the PMOS transistor P2.

With this circuit construction, as the voltage applied to the gate of the PMOS transistor P1 in the flip-flop circuit can be reduced, there is no need of increasing the thickness of the gate oxide film of each of the PMOS transistors P1~P5 constituting the level-shift circuit. Therefore, all the MOS transistors may have a thin gate oxide film. In other words, a process of fabricating PMOS transistors having thick gate oxide films can be omitted to simplify the manufacturing process.

As has been described in the foregoing, in the level-shift circuit according to the invention, a PMOS transistor whose gate and drain are tied together is connected between the higher potential power supply terminal and the gate of the output stage PMOS transistor so that the PMOS transistor together with the output stage PMOS transistor constitutes a current-mirror circuit.

Thus, the level-shift circuit according to the invention can provide a constant-current output as the high level output. It is thus possible to omit such a high resistance protection resistor that is conventionally connected to the output end for preventing the destruction of the circuit caused by the short-circuitting of the output, and it is also possible to increase the integration density, reduce the size and cost and improve the reliability of the circuit.

While the invention has been described in its preferred embodiments, it is to be understood that the words which have been used are words of description rather than limitation and that changes within the purview of the appended claims may be made without departing from the true scope and spirit of the invention in its broader aspects.

What is claimed is:

1. A flip-flop type level-shift circuit comprising:
   a flip-flop circuit (P1, P2, N1, N2) provided between a first power supply terminal ($T_H$) and a second power supply terminal ($T_L$, GND) and having a first output node and a second output node;
   an input terminal;
   an output terminal;
   a control circuit interconnected between said input terminal and said flip-flop circuit, for generating a first gate control signal and a second gate control signal in response to an input signal applied to said input terminal, said flip-flop circuit receiving said first and second gate control signal;
   an output stage circuit including a first P-channel MOS transistor (P4) and a first N-channel MOS transistor (N3) connected in series between said first and second power supply terminals, said first P-channel MOS transistor (P4) having a source connected to said first power supply terminal, a gate connected to said first output node of said flip-flop circuit, and a drain connected to said output terminal, and said first N-channel MOS transistor (N3) having a drain connected to said output terminal, a gate connected to said control circuit and receiving said second gate control signal, and a source connected to said second power supply terminal; and a second P-channel MOS transistor (P3) connected between said first power supply terminal and the gate of said first P-channel MOS transistor (P4) in said output stage circuit, said second P-channel MOS transistor having a source connected to said first power supply terminal, and a gate and a drain connected in common to the gate of said first P-channel MOS transistor, said second P-channel MOS transistor (P3) constituting a current-mirror circuit with said first P-channel MOS transistor (P4) so as to cause a constant current flow in said first P-channel MOS transistor of said output stage circuit.

2. A flip-flop type level-shift circuit according to claim 1, wherein said flip-flop circuit includes third and fourth P-channel MOS transistors (P2,P1) and second and third N-channel MOS transistors (N1,N2), said third P-channel MOS transistor (P2) and said second N-channel MOS transistor (N1) being connected in series between said first power supply terminal and said second power supply terminal so that said first output node is formed therebetween, said fourth P-channel MOS transistor (P1) and said third N-channel MOS transistor (N2) being connected in series between said first power supply terminal and said second power supply terminal so that said second output node is formed therebetween, said third and fourth P-channel MOS transistors (P2,P1) having gates cross-connected to said second and first output nodes, respectively, and said second and third N-channel MOS transistors (N1,N2) having gates receiving said first and second gate control signals, respectively, from said control circuit.

3. A level-shift circuit according to claim 2, and further comprising a fifth P-channel MOS transistor (P5) connected between said first power supply terminal ($T_H$) and said second output node of said flip-flop circuit, said fifth P-channel MOS transistor (P5) having a source connected to said first power supply terminal and a drain and a gate connected in common to said second output node of said flip-flop circuit.

4. A level-shift circuit according to claim 1, wherein said first power supply terminal ($T_H$) is a power supply source of a higher potential than that of said second power supply terminal.

* * * * *